United States Patent [19]

Raghunathan

[11] Patent Number: 4,751,678
[45] Date of Patent: Jun. 14, 1988

[54] ERASE CIRCUIT FOR CMOS EEPROM

[75] Inventor: Kuppuswamy Raghunathan, Austin, Tex.

[73] Assignee: Motorola, Inc., Schaumburg, Ill.

[21] Appl. No.: 797,273

[22] Filed: Nov. 12, 1985

[51] Int. Cl.[4] .............................................. G11C 7/00
[52] U.S. Cl. .................................. 365/189; 365/185; 365/230
[58] Field of Search ............... 365/184, 185, 103, 104, 365/94, 189, 218

[56] References Cited

U.S. PATENT DOCUMENTS 4,368,524  1/1983  Nakamura et al. .................. 365/185
4,599,707  7/1986  Fang ................................... 365/185
4,616,339  10/1986 Cuppens et al. ..................... 365/185

Primary Examiner—Stuart N. Hecker
Assistant Examiner—Glenn A. Gossage
Attorney, Agent, or Firm—John A. Fisher; Jeffrey Van Myers; James L. Clingan, Jr.

[57] ABSTRACT

An erase circuit for an EEPROM is provided which only uses enhancement type transistors. This eliminates having to use additional processing steps to provide depletion type transistors in a CMOS process. Enhancement type transistors are used to provide the erase voltage to the control gate of an electrically erasable memory cell. An additional enhancement type transistor is used to maintain the control gate in a non-floating condition during non-erase periods.

5 Claims, 1 Drawing Sheet

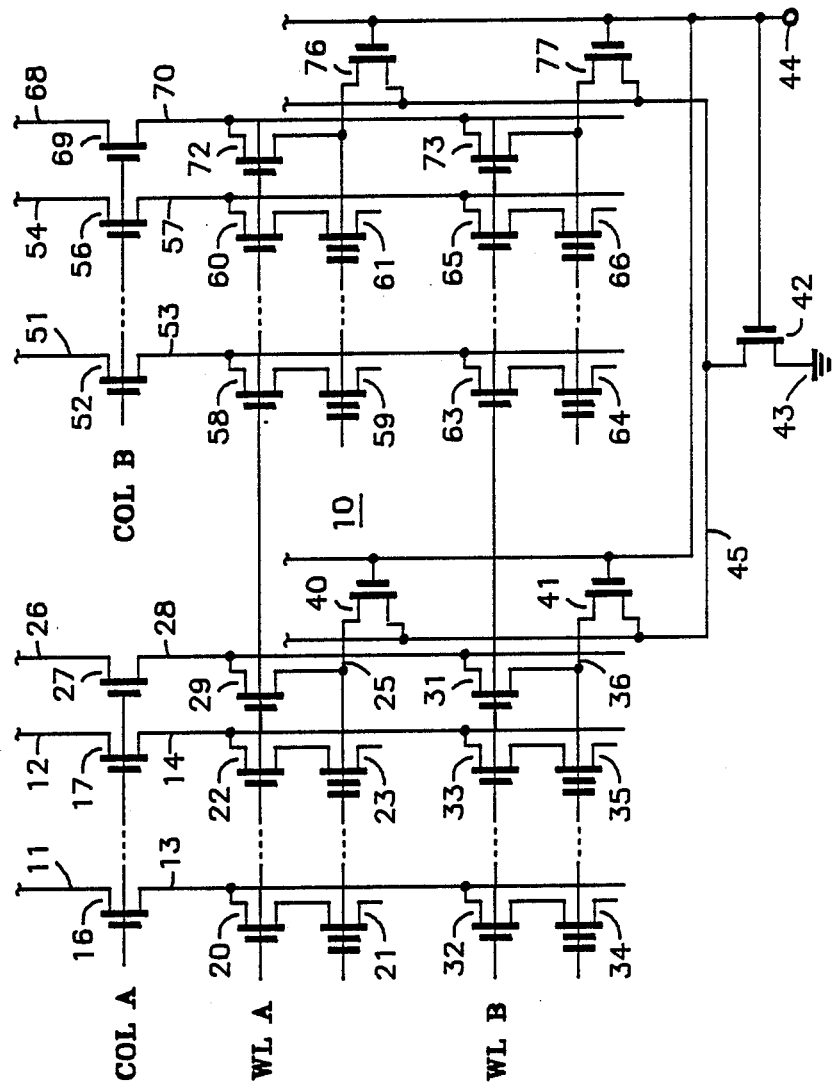

4,751,678

ERASE CIRCUIT FOR CMOS EEPROM

BACKGROUND OF THE INVENTION

This invention relates, in general, to Electrically Erasable Programmable Read Only Memories (EEPROM), and more particularly, to an erase circuit for a CMOS EEPROM which does not use depletion type transistors.

In the past, it has been common practice to use depletion type transistors as controllable coupling transistors to couple a high voltage to the control gate of an electrically erasable memory cell. A depletion type transistor is capable of coupling essentially the total voltage from its drain to its source when the transistor is enabled. In order to render a depletion type transistor non-conductive, a negative voltage must be applied to its gate electrode. However, if zero volts is applied to the gate electrode of a depletion type transistor, it will be rendered partially non-conductive. Such characteristics of the depletion type transistor have rendered themselves very useful for coupling an erase voltage to the control gate of an electrically erasable memory cell. Since a high voltage is needed as the erase voltage, the depletion type transistor is very useful for coupling the high voltage. On the other hand, when the memory cell is not being erased it is desirable to keep its control gate from floating and therefore by applying zero volts to the gate electrode of the depletion type coupling transistor, the control gate is kept from floating.

A problem arises when an EEPROM is manufactured using a CMOS process. To make a depletion type transistor in a CMOS process would entail additional process steps which are undesirable because of the added time and expense involved.

Accordingly, it is an object of the present invention to provide an erase circuit for an EEPROM which does not use depletion type transistors.

Another object of the present invention is to provide an erase circuit for an EEPROM which uses only enhancement type transistors.

SUMMARY OF THE INVENTION

The above and other objects and advantages of the present invention are achieved by using an enhancement type transistor to couple an erase voltage to a control gate of an Electrically Erasable Programmable Read Only Memory cell. Another enhancement type transistor is used to controllably couple a reference voltage to the control gate when the memory cell is not being erased.

BRIEF DESCRIPTION OF THE DRAWING

The single FIGURE illustrates a portion of an EEPROM having an erase circuit which uses only enhancement type transistors.

The exemplification set out herein illustrates a preferred embodiment of the invention in one form thereof, and such exemplification is not to be construed as limiting in any manner.

DETAILED DESCRIPTION OF THE DRAWING

The single FIGURE illustrates a portion of an EEPROM array 10. The memory cells of the array are illustrated as being arranged in byte configuration; however, it will be understood that the present erase circuit could be used with any arrangement of EEPROM cells. Transistors 20 and 21 comprise a single cell of the memory. Transistor 20 is a typical enhancement type transistor and transistor 21 is a typical floating gate field effect transistor. This means that transistor 21 has a floating gate as well as a control gate. Transistor 21 can be programmed by applying a high voltage to the drain electrode, ground potential to the control gate, while the source is left floating. In order to read data from the cell, the control gate and the source are both held at ground potential while the drain electrode is coupled to bit line 13 by transistor 20. In order to erase the memory cell a high voltage must be applied to the control gate while the source and drain are held at ground potential. In a typical EEPROM, ground potential is zero volts. In the memory array illustrated, the source electrodes of the electrically erasable transistors can be controllably switched to ground or left floating.

Line 11 is a data line and is coupled to bit line 13 by a transistor 16. Transistor 16 is controlled by Column A (COL A) select signal. Data line 11 may carry ground potential, a high voltage which is used to program the memory cell, or the data from the memory cell which is then picked up by a sense amplifier. In otherwords, the destination of line 11 is controlled by peripheral circuitry which is not shown. Bit line 13 is shown as also being connected to a memory cell comprising transistors 32 and 34.

Data line 12 is coupled to bit line 14 by a transistor 17. The gate electrode of transistor 17 receives the Column A select signal. Bit line 14 is connected to the drain electrode of a transistor 22 and to the drain electrode of a transistor 33. The source of transistor 22 is connected to the drain of a floating gate transistor 23. The source of transistor 33 is connected to the drain electrode of a floating gate transistor 35. The gate electrodes of transistors 20 and 22 receive a Word Line A (WLA) signal which is used to couple all the memory cells, which are controlled by Word Line A, to their respective bit lines. In a typical arrangement, the memory cell comprising transistors 20 and 21 would be one bit of the byte while the memory cell comprising transistors 22 and 23 would comprise another bit of the byte. In such a configuration bit line 13 could represent bit 0 while bit line 14 could represent bit 7 of the byte, assuming an 8 bit byte.

The gate electrodes of transistors 32 and 33 are connected and controlled by Word Line B (WLB) select signal. The gate electrodes or control gates of the floating gate transistors 21, 23, 34, and 35 are only accessed once and that is during an erase operation. At all other times the control gates are kept from floating by being tied to ground, which serves as a reference potential.

Line 26 is coupled to byte erase line 28 by a transistor 27. Transistor 27 is controlled by the Column A select signal. Transistor 29 couples the erase voltage from erase line 28 to line 25. The gate electrode of transistor 29 is connected to the gate electrodes of transistors 20 and 22 and is thereby controlled by WLA. Line 25 is connected to the control gates of transistors 21 and 23. Transistor 40 couples line 25 to line 45 which is connected to the drain electrode of transistor 42. Transistor 42 controllably couples a voltage potential illustrated as ground 43 to line 45. A mode input select signal appearing on terminal 44 and thus on the gate of transistor 42 serves to control transistor 42. During program and read the mode input select signal is at a high level, such as voltage Vcc, to enable transistor 42 while during erase the mode input select signal is at a low level such as ground potential. Transistor 40 is used primarily for isolation considerations. The gate electrode of transistor 40 is connected to terminal 44. Erase line 28 is coupled by transistor 31 to line 36. Line 36 is connected to the control gates of transistors 34 and 35. The gate of transistor 31 is connected to the gates of transistors 32 and 33 which are controlled by the Word Line B signal. Line 36 is coupled to line 45 by isolation transistor 41. Transistor 40 and 41 provide isolation between lines 25 and 36 during erase. The gate of transistor 41 is connected to terminal 44 which receives the mode input select signal.

Transistors 27, 29, 31, 40, 41, and 42 are all enhancement type transistors and are provided for the purpose of supplying an erase capability to the electrically erasable memory cells. Transistors 27, 29, and 31 supply the erase voltage to the control gates of transistors 21, 23, 34, and 35. Transistors 40, 41, and 42 are provided to keep the control gates from floating when an erase is not being performed.

The right half of the single FIGURE illustrates additional memory cells and circuitry which is similar and functions the same as the cells and circuitry shown on the left half of the FIGURE. Data line 51 is coupled by transistor 52 to bit line 53. Bit line 53 is connected to the drain electrodes of transistors 58 and 63. The source electrode of transistor 58 is connected to the drain electrode of floating ate transistor 59. The gate electrode of transistor 58 is controlled by Word Line A while the gate electrode of transistor 63 is controlled by Word Line B. The source of transistor 63 is connected to the drain of floating gate transistor 64. Data line 54 is coupled to bit line 57 by transistor 56. Bit line 57 is connected to drain electrodes of transistors 60 and 65. The source of transistor 60 is connected to the drain electrode of floating gate transistor 61. The gate of transistor 60 is connected to receive Word Line A select signal. The source of transistor 65 is connected to the drain of floating gate transistor 66. The gate electrode of transistor 65 is connected to receive Word Line B select signal. Line 68 which is capable of providing a high voltage for erasing the memory cells is coupled to erase line 70 by transistor 69. The gate electrode of transistor 69 is connected to the gate electrodes of transistors 52 and 56 which receive the Column B (COL B) signal. Erase line 70 is coupled to the control gates of transistors 59 and 61 by transistor 72. Erase line 70 is also coupled to the control gates of transistors 64 and 66 by transistor 73. Transistor 76 couples the control electrode of trnasistors 59 and 61 to line 45. Transistor 77 couples the control electrodes of transistors 64 and 66 to line 45. The gate electrodes of transistor 76 and 77 are connected to terminal 44.

The erase voltage and the programming voltage are both approximately 20 volts. The Column A and Column B voltages are also approximately 20 volts and therefore when the transistor coupled the erase voltage is enabled by the Column A or Column B signal the voltage coupled to the erase line is approximately 20 volts minus the threshold voltage of the coupling transistor. Even though the coupling transistor reduces the voltage by its threshold value, the voltage will still be high enough to erase the memory cell. During the erase operation the Word Line A and/or Word Line B signal is approximately 20 volts. However, only one of these voltages will be at the high level during a particular erase operation. The non-selected Word Line will be at a lower voltage so that the full erase voltage is not coupled to the control gates of the memory cells controlled by that particular non-selected Word Line signal.

By now it should be appreciated that there has been provided an erase circuit that does not use depletion type transistors which are fully compatible, without requiring additional steps, with the CMOS process.

What is claimed is:

1. An EEPROM having a plurality of electrically erasable memory cells, each such memory cell having a control gate, the EEPROM characterized as having a read mode, a program mode, and an erase mode, the EEPROM further having an erase circuit comprising:
   a first enhancement transistor having a drain for receiving an erase signal, a gate for receiving a first control signal, and a source connected to an erase line;
   a second enhancement transistor having a drain coupled to the erase line, a gate for receiving a second control signal, and a source coupled to the control gate of at least one of the memory cells; and
   coupling means for coupling a reference voltage to the control gate of the memory cell coupled to the second enhancement transistor when the EEPROM is in one of the read mode and program mode and the first and second enhancement transistors are disabled.

2. An EEPROM having a plurality of electrically erasable memory cells, each such memory cell having a control gate, the EEPROM further having an erase circuit comprising:
   a first enhancement transistor for controllably coupling a voltage for erasing to an erase line;
   a second enhancement transistor for controllably coupling the erase line to the control gate of at least one of the memory cells; and
   coupling means for controllably coupling a reference voltage to the control gate of each of the memory cells at times when the first and second enhancement type transistors are not enabled.

3. The EEPROM of claim 2 wherein the plurality of memory cells are grouped in a byte configuration and further includes a plurality of second enhancement type transistors to selectively couple each group of byte configured memory cells to the erase line.

4. An EEPROM having a plurality of electrically erasable memory cells, each such memory cell having a control gate, the EEPROM characterized as having a read mode, a program mode, and an erase mode, the EEPROM further having an erase circuit comprising:
   a first enhancement transistor having a drain for receiving an erase signal, a gate for receiving a first control signal, and a source connected to an erase line;
   a second enhancement transistor having a drain coupled to the erase line, a gate for receiving a second control signal, and a source coupled to the control gate of at least one of the memory cells; and
   a third transistor having a drain connected to the control gate of the memory cell coupled to the second enhancement transistor, a gate for receiving a third control signal, and a source for receiving the reference voltage.

5. The EEPROM of claim 4 further comprising a fourth transistor which couples the reference voltage to the source of the third transistor in response to the third control signal.

* * * * *